United States Patent
Ahn et al.

(10) Patent No.: US 9,941,313 B2
(45) Date of Patent: Apr. 10, 2018

(54) METHOD OF MANUFACTURING THIN FILM TRANSISTOR SUBSTRATE

(71) Applicant: SAMSUNG DISPLAY CO., LTD., Yongin-si, Gyeonggi-do (KR)

(72) Inventors: Kiwan Ahn, Yongin-si (KR); Junghyun Kim, Yongin-si (KR); Seunghwan Cho, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/987,615

(22) Filed: Jan. 4, 2016

(65) Prior Publication Data

US 2016/0372498 A1 Dec. 22, 2016

(30) Foreign Application Priority Data

Jun. 22, 2015 (KR) .................. 10-2015-0088716

(51) Int. Cl.
*H01L 21/84* (2006.01)
*H01L 27/12* (2006.01)
*H01L 29/66* (2006.01)
*H01L 29/786* (2006.01)

(52) U.S. Cl.
CPC .... *H01L 27/1288* (2013.01); *H01L 29/66757* (2013.01); *H01L 29/78621* (2013.01); *H01L 29/78645* (2013.01)

(58) Field of Classification Search
CPC ........... H01L 27/1288; H01L 29/66757; H01L 27/3262; H01L 29/78621; H01L 29/78645
See application file for complete search history.

(56) References Cited

U.S. PATENT DOCUMENTS

| | | | | |
|---|---|---|---|---|
| 6,235,564 B1* | 5/2001 | Itoh | ................... | H01L 21/28114 257/E21.205 |
| 6,706,544 B2* | 3/2004 | Yamazaki | ........... | H01L 27/1214 257/E21.413 |
| 8,084,311 B1* | 12/2011 | Horak | ............... | H01L 21/76897 438/183 |
| 2002/0182789 A1* | 12/2002 | Park | ....................... | H01L 27/12 438/163 |
| 2006/0030089 A1 | 2/2006 | Chung | | |
| 2007/0001945 A1 | 1/2007 | Yoshida et al. | | |

(Continued)

FOREIGN PATENT DOCUMENTS

KR    10-2008-0013451    2/2008

*Primary Examiner* — Richard Booth
(74) *Attorney, Agent, or Firm* — F. Chau & Associates, LLC

(57) ABSTRACT

A method of manufacturing a thin film transistor substrate includes forming a semiconductor pattern on a substrate, wherein the semiconductor pattern includes a first area, a second area, and a third area, wherein the second area and the third area are located on each side of the first area; forming an insulating layer on the substrate to cover the semiconductor pattern; forming a metal pattern layer on the insulating layer using a first photosensitive pattern; doping the semiconductor pattern with first impurities using the first photosensitive pattern; forming a gate electrode by patterning the metal pattern layer using a second photosensitive pattern; and doping the semiconductor pattern with second impurities having a lower concentration than the first impurities.

18 Claims, 5 Drawing Sheets

(56) References Cited

U.S. PATENT DOCUMENTS

| | | |
|---|---|---|
| 2008/0035937 A1 | 2/2008 | Jung et al. |
| 2012/0001244 A1 | 1/2012 | Yamazaki et al. |
| 2012/0175627 A1 | 7/2012 | Sun et al. |
| 2012/0313172 A1* | 12/2012 | Matsudaira ............ H01L 21/84 257/347 |
| 2014/0367776 A1 | 12/2014 | Pang |

* cited by examiner

METHOD OF MANUFACTURING THIN FILM TRANSISTOR SUBSTRATE

CROSS-REFERENCE TO RELATED APPLICATION

This application claims priority under 35 U.S.C. § 119 from, and the benefit, of Korean Patent Application No. 10-2015-0088716, filed on Jun. 22, 2015, in the Korean Intellectual Property Office, the contents of which are herein incorporated by reference in their entirety.

BACKGROUND

1. Technical Field

One or more exemplary embodiments are directed to a method of manufacturing a thin film transistor substrate.

2. Discussion of the Related Art

Organic light-emitting display apparatuses include two electrodes and an organic emission layer between the two electrodes. Excitons can form in the organic emission layer from combinations of electrons injected from one electrode and holes injected from the other electrode, and the excitons can emit energy in the form of light.

An organic light-emitting display apparatus includes a plurality of pixels that include organic light-emitting diodes, which are self-emitting devices. Each pixel includes a plurality of thin film transistors and one or more capacitors for driving the organic light-emitting diode. A thin film transistor has a property in that the thin film transistor generates a driving current as well as an off current.

SUMMARY

One or more exemplary embodiments include a method of manufacturing a thin film transistor substrate.

Additional aspects will be set forth in part in the description which follows and, in part, will be apparent from the description, or may be learned by practice of the presented embodiments.

According to one or more exemplary embodiments, a method of manufacturing a thin film transistor substrate includes forming a semiconductor pattern on a substrate, wherein the semiconductor pattern includes a first area, a second area, and a third area, wherein the second area and the third area are located on each side of the first area; forming an insulating layer on the substrate to cover the semiconductor pattern; forming a metal pattern layer on the insulating layer using a first photosensitive pattern; doping the semiconductor pattern with first impurities using the first photosensitive pattern; forming a gate electrode by patterning the metal pattern layer using a second photosensitive pattern; and doping the semiconductor pattern with second impurities having a lower-concentration than to the first impurities.

The metal pattern layer may be formed on a position corresponding to the first area of the semiconductor pattern.

Doping the semiconductor pattern with first impurities may comprise doping the second area and the third area of the semiconductor pattern with the first impurities.

The first photosensitive pattern may be one of a slit mask and a half-tone mask.

Forming a metal pattern layer on the insulating layer using a first photosensitive pattern may comprise sequentially stacking a metal layer and a photosensitive layer on the insulating layer, forming the first photosensitive pattern from the photosensitive layer using a photo mask, and etching the metal layer using the first photosensitive pattern as a mask to form the metal pattern layer The second photosensitive pattern may be formed by ashing the first photosensitive pattern.

The first area of the semiconductor pattern may include a fourth area, a fifth area and a sixth area, the fourth area corresponding to a central area of the first area, and the fifth area and the sixth area being located on each side of the fourth area.

A thickness of a portion of the first photosensitive pattern that corresponds to the fourth area may be less than a thickness of a portion that corresponds to the fifth area and the sixth area.

A thickness of a portion of the second photosensitive pattern corresponding to the fifth area and the sixth area may be less than the thickness of the portion of the first photosensitive pattern corresponding to the fifth area and the sixth area, and the second photosensitive pattern may include an opening corresponding to the fourth area.

Forming the gate electrode comprises forming a first gate electrode and a second gate electrode spaced apart from each other in the fifth area and the sixth area, respectively.

The fourth area of the semiconductor pattern corresponds to a space between the first gate electrode and the second gate electrode and may be doped with the second impurities.

A width of the first gate electrode and a width of the second gate electrode may be less than a width of the fifth area and a width of the sixth area, respectively.

Doping the semiconductor pattern with second impurities is performed using the gate electrode as a mask.

A portion of the fifth area and a portion of the sixth area of the semiconductor pattern may be doped with the second impurities.

According to one or more exemplary embodiments, a method of manufacturing a thin film transistor substrate includes forming a semiconductor pattern on a substrate; forming a metal pattern layer on the semiconductor pattern using a first photosensitive pattern; doping the semiconductor pattern with first impurities using the first photosensitive pattern; forming a gate electrode by patterning the metal pattern layer using a second photosensitive pattern to form a first gate electrode and a second gate electrode spaced apart from each other; and doping the semiconductor pattern with second impurities having a lower concentration than the first impurities using the gate electrodes as a mask.

The semiconductor pattern may comprise a first area, a second area, and a third area, wherein the second area and the third area are disposed on each side of the first area. The metal pattern layer may be formed on a position corresponding to the first area of the semiconductor pattern, and the first impurities may be doped into the second area and the third area of the semiconductor pattern.

The first area of the semiconductor pattern may comprise a fourth area, a fifth area and a sixth area. The fourth area may correspond to a central portion of the first area, and the fifth area and the sixth area may be located on each side of the fourth area. The first gate electrode and second gate electrode may be formed in the fifth area and the sixth area, respectively, and the fourth area of the semiconductor pattern may correspond to a space between the first gate electrode and the second gate electrode.

A width of the first gate electrode and a width of the second gate electrode may be less than a width of the fifth area and a width of the sixth area, respectively, and the fourth area, a portion of the fifth area and a portion of the sixth area of the semiconductor pattern may be doped with the second impurities.

A thickness of a portion of the first photosensitive pattern that corresponds to the fourth area may be less than a thickness of a portion corresponding to the fifth area and the sixth area; and a thickness of a portion of the second photosensitive pattern corresponding to the fifth area and the sixth area may be less than the thickness of the portion of the first photosensitive pattern corresponding to the fifth area and the sixth area. The second photosensitive pattern may comprise an opening corresponding to the fourth area.

The method may further comprise forming an insulating layer on the substrate to cover the semiconductor pattern. Forming a metal pattern layer on the insulating layer using a first photosensitive pattern may comprise sequentially stacking a metal layer and a photosensitive layer on the insulating layer, forming the first photosensitive pattern from the photosensitive layer using a photo mask, and etching the metal layer using the first photosensitive pattern as a mask to form the metal pattern layer.

DETAILED DESCRIPTION

Figure 1:
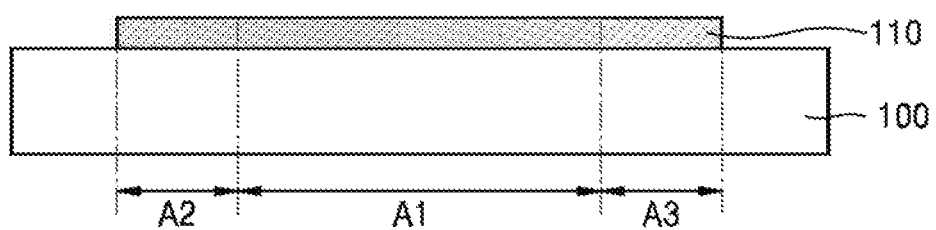
FIGS. 1 to 3G are schematic cross-sectional views that illustrate a method of manufacturing a thin film transistor substrate according to t an embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

Hereinafter, the inventive concept will be described in detail by explaining exemplary embodiments of the inventive concept with reference to the attached drawings. Like reference numerals in the drawings may denote like elements, and thus their description will be omitted.

It will be understood that when a layer, area, or component is referred to as being "formed on" another layer, area, or component, it can be directly or indirectly formed on the other layer, area, or component.

Sizes of components in the drawings may be exaggerated for convenience of explanation.

It will be understood that when a layer, area, or component is referred to as being "connected" to other layer, area, or component, it may be "directly connected" to or "indirectly connected" to other layer, area, or component with intervening elements therebetween.

Figure 2:
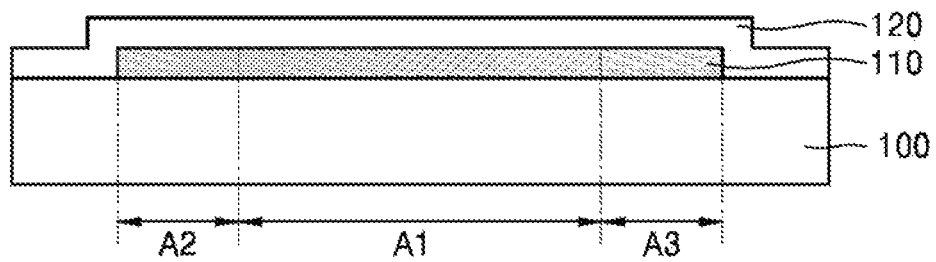

FIGS. 1 to 3G are schematic cross-sectional views illustrating a method of manufacturing a thin film transistor substrate according to an embodiment. FIG. 1 is a cross-sectional view that illustrates a thin film transistor substrate fabricated according to a first mask process. FIG. 2 is a cross-sectional view that illustrates a thin film transistor substrate of FIG. 1 of which a first insulating layer 120 is formed on a substrate 100. FIGS. 3A to 3G are cross-sectional views that illustrate a thin film transistor substrate fabricated according to a second mask process.

Referring to FIG. 1, a semiconductor pattern 110 is formed on the substrate 100.

The substrate 100 may include a glass material, a metallic material, or a plastic material, such as polyethylene terephthalate (PET), polyethylene naphthalate (PEN), or polyimide. Before forming the semiconductor pattern 110, a buffer layer can be formed on the substrate 100 to improve surface smoothness of the substrate 100 and prevent impurity elements from penetrating into the substrate 100. The buffer layer may include an insulating material, such as silicon oxide or silicon nitride, and may include a single layer or multiple layers.

The semiconductor pattern 110 can be formed by forming a semiconductor material on the substrate 100, followed by patterning the semiconductor material. In addition, the semiconductor material is coated with a photoresist, followed by a photolithography process that use a first photo mask to pattern a semiconductor layer. A first photolithography mask process can be carried out by an exposure using a first photo mask, followed by developing, etching, and stripping or ashing.

According to an embodiment, the semiconductor material includes amorphous silicon or polysilicon. Polysilicon can be formed by crystallizing amorphous silicon. Amorphous silicon can be crystallized using any suitable method, such as rapid thermal annealing (RTA), solid phase crystallization (SPC), excimer laser annealing (ELA), metal-induced crystallization (MIC), metal-induced lateral crystallization (MILC), or sequential lateral solidification (SLS).

The semiconductor pattern 110 includes a first area A1, and a second area and third area A2 and A3, which are disposed on either side of the first area A1 on the substrate 100.

Referring to FIG. 2, the first insulating layer 120 is formed on the substrate 100 to cover the semiconductor pattern 110. According to an embodiment, the first insulating layer 120 includes an insulating material, such as silicon oxide or silicon nitride.

Figure 3A:
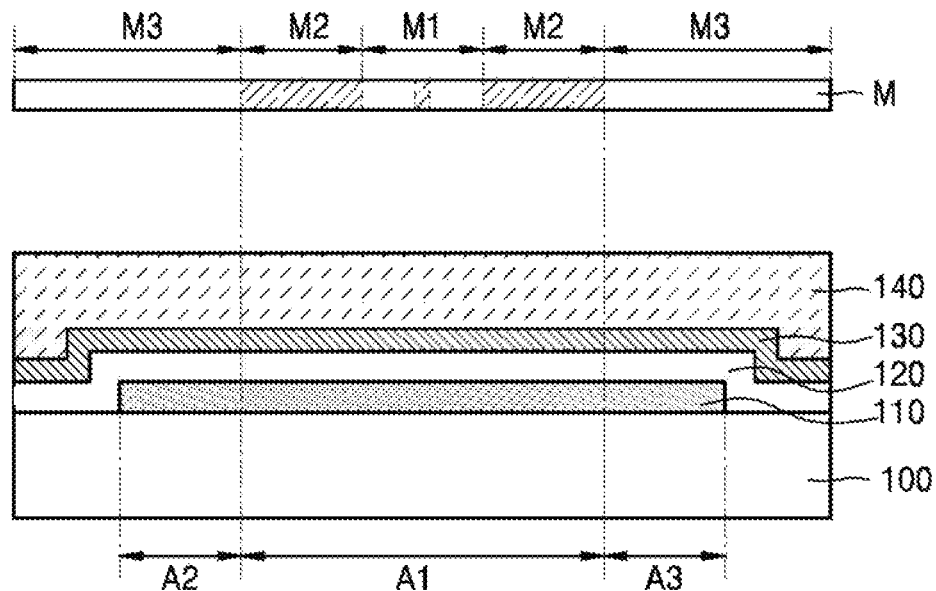
Figure 3B:
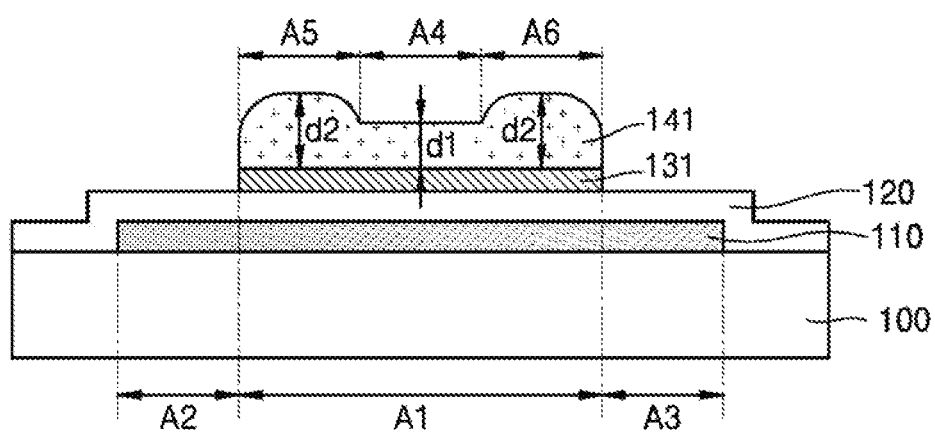

According to an embodiment, referring to FIGS. 3A and 3B, a first metal layer 130 and a first photosensitive layer 140 are sequentially stacked on the first insulating layer 120, and then, a first photosensitive pattern 141 is formed using a second photo mask M. The first photosensitive pattern 141 can be formed by exposing and developing the first photosensitive layer 140 using the second photo mask M.

According to an embodiment, the first area A1 in the semiconductor pattern 110 includes a fourth area A4, a fifth area A5, and a sixth area A6. The fourth area A4 corresponds to the central area of the first area A1, and the fifth and sixth areas A5 and A6 are located on each side of the fourth area A4. A thickness d1 of a portion of the first photosensitive pattern 141 in the fourth area A4 is less than the thickness d2 of a portion of the first photosensitive pattern 141 in the fifth and sixth areas A5 and A6.

In some embodiments, the first photosensitive pattern 141 is formed using the second photo mask M, which is capable of adjusting the intensity of light. The second photo mask M may be one of a slit mask and a half-tone mask.

In some embodiments, if the second photo mask M is a slit mask, the second photo mask M includes a slit portion M1 that includes at least one slit bar to block out light, a light-blocking portion M2 to block out light, and a light-transmitting portion M3 to transmit light. In some embodiments, if the second photo mask M is a half-tone mask, the second photo mask M includes a semi-transmissive portion M1 to adjust the intensity of light, a light-blocking portion M2 to block out light, and a light-transmitting portion M3 to transmit light. The second photo mask M that adjusts the intensity of light is not particularly limited thereto. However, for convenience of description, the second photo mask M will be described as a slit mask.

If the second photo mask M is a slit mask, the slit portion M1 and the light-blocking portion M2 correspond to the first area A1 of the semiconductor pattern 110. As shown in FIG. 3A, the slit portion M1 corresponds to the fourth area A4, which is the central area of the first area A1. The light-blocking portion M2 on each side of the slit portion M1 corresponds to the fifth area A5 and the sixth area A6. The light-transmitting portion M3 is the remaining area other than the slit portion M1 and the light-blocking portion M2. The above-described disposition is possible when the material of the first photosensitive layer 140 is a positive photoresist (PR). However, when the material of the first photosensitive layer 140 is a negative PR, the position of the light-transmitting portion and the position of the light-blocking portion are reversed. In a present embodiment, for convenience of description, the material of the first photosensitive layer 140 will be described as a positive PR.

Thereafter, according to an embodiment, a metal pattern layer 131 is formed on the first insulating layer 120 using the first photosensitive pattern 141. The metal pattern layer 131 can be formed by etching that portion of the first metal layer 130 not covered by the first photosensitive pattern 141, in a first etching. The metal pattern layer 131 is formed at a position that corresponds to the first area A1 of the semiconductor pattern 110 using the first photosensitive pattern 141.

The first metal layer 130 may have a single or multi-layer structure using one or more metals selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

In a present embodiment, the first photosensitive pattern 141 is formed using a photo mask that can adjust the intensity of light. However, embodiments are not limited thereto. In some embodiments, the distance between the fifth area A5 and the sixth area A6 is less than the photo masking capability. If the distance between the fifth area A5 and the sixth area A6 is less than the photo masking capability, a portion of the first photosensitive layer 140 corresponding to the fourth area A4 may not be exactly patterned, thereby being thinner than the thickness of the portions of the first photosensitive layer 140 corresponding to the fifth and sixth areas A5 and A6. However, in a present embodiment, for convenience of description, the photo mask is capable of adjusting the intensity of light.

Figure 3C:
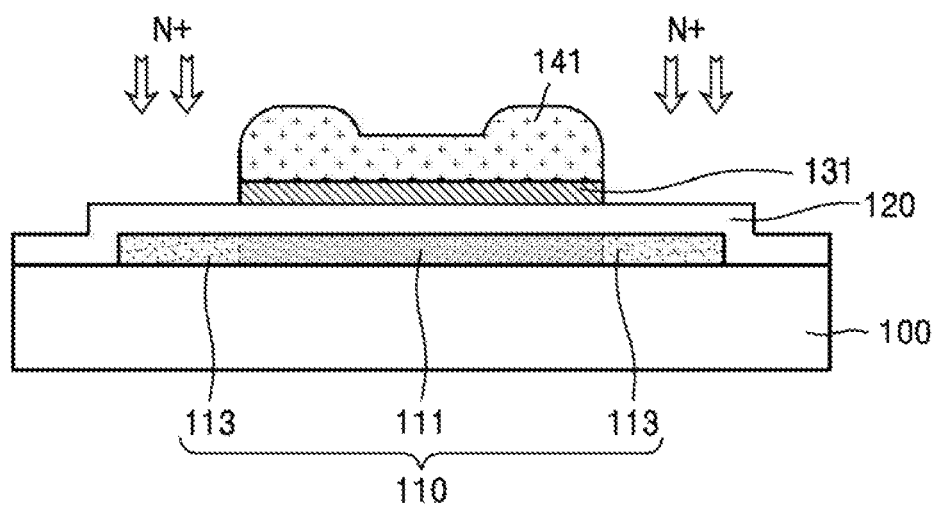

According to an embodiment, referring to FIG. 3C, the semiconductor pattern 110 is doped with first impurities N+ using the first photosensitive pattern 141. The first impurities may include boron ions or phosphorous ions at a high-concentration of about $1 \times 10^{12}$ atoms/cm$^2$ or more, for example, about $1 \times 10^{16}$ atoms/cm$^2$ or more. Since the semiconductor pattern 110 is doped with the first impurities using the first photosensitive pattern 141 and the metal pattern layer 131 as masks, the first impurities can be implanted into the second and third areas A2 and A3 of the semiconductor pattern 110, to form highly doped areas 113, but not into the first area A1, which forms a channel area 111. In a first doping, the first impurities are implanted at a high-concentration, compared to an implanting of second impurities that will be described below. The second and third areas A2 and A3 form a heavily-doped area 113 that can be a source area or a drain area. The source area and the drain area can serve as a source electrode and a drain electrode, respectively.

Figure 3D:
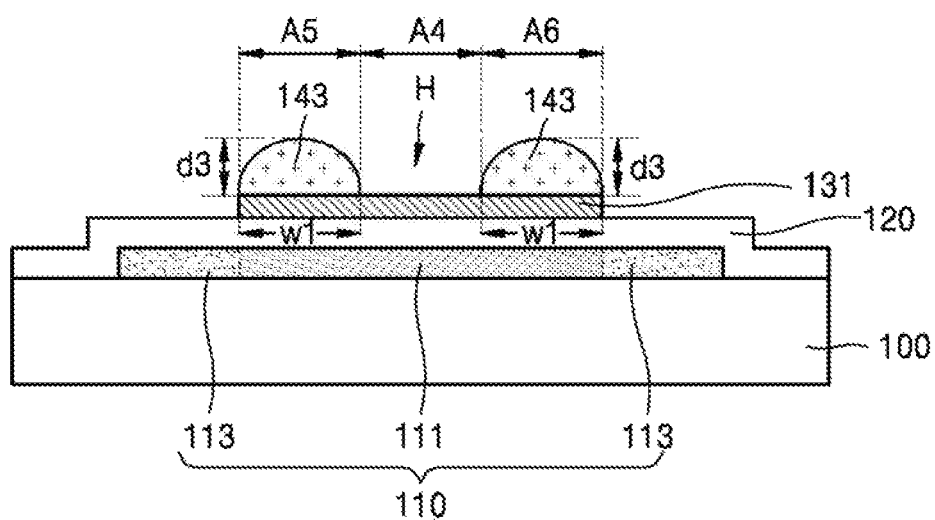

According to an embodiment, referring to FIG. 3D, a second photosensitive pattern 143 is formed by ashing the first photosensitive pattern 141.

Of the first photosensitive pattern 141, part of photoresist corresponding to the fourth area A4 may be removed by ashing. The thickness of the fifth and sixth area portions A5 and A6 of the first photosensitive pattern 141 is also reduced. Accordingly, in the second photosensitive pattern 143, a thickness d3 of the fifth and sixth area portions A5 and A6 is less than the thickness d2 of the fifth and sixth area portions A5 and A6 of the first photosensitive pattern 141, and the second photosensitive pattern 143 includes an opening H corresponding to the fourth area A4.

Figure 3E:
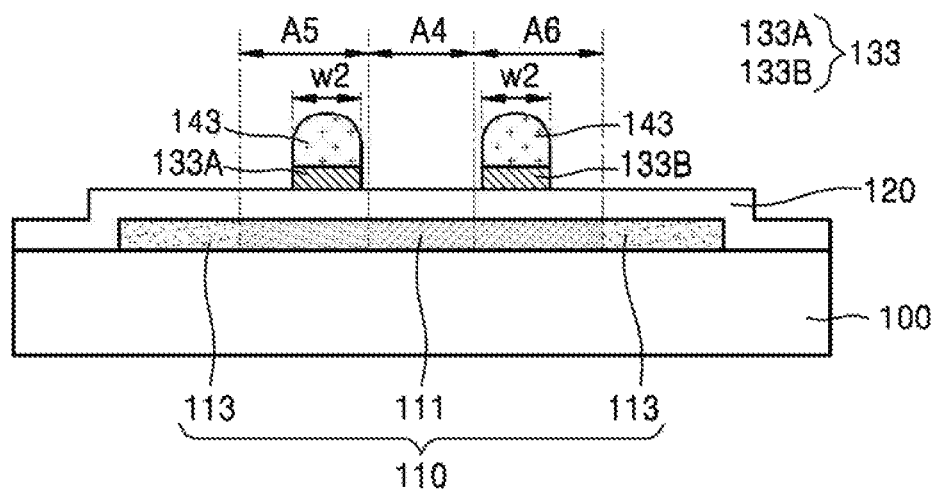

According to an embodiment, referring to FIG. 3E, the metal pattern layer 131 is patterned using the second photosensitive pattern 143. A gate electrode 133 can be formed as a result of the patterning. The gate electrode 133 includes a first gate electrode 133A and a second gate electrode 133B that are spaced apart from each other and that respectively correspond to the fifth area A5 and the sixth area A6.

According to an embodiment, the gate electrode 133 is formed by etching a portion of the metal pattern layer 131 exposed through the second photosensitive pattern 143, in a second etching. The first etching and the second etching may be dry etchings. As the second photosensitive pattern 143 serves as a mask, a portion of the metal pattern layer 131 corresponding to the opening H is removed. Thus, the first gate electrode 133A of the gate electrode 133 and the second gate electrode 133B of the gate electrode 133 are spaced apart from each other and respectively correspond to the fifth and sixth areas A5 and A6.

According to an embodiment, the width of the second photosensitive pattern 143 decreases due to the second etching. For example, a width w2 of the second photosensitive pattern 143 after performing the second etching is less than the width w1, shown in FIG. 3D, of the second photosensitive pattern 143 before performing the second etching. Accordingly, the widths of the first gate electrode 133A and the second gate electrode 133B, which are patterned using the second photosensitive pattern 143, are less than the widths of the fifth and sixth areas A5 and A6, respectively.

Figure 3F:
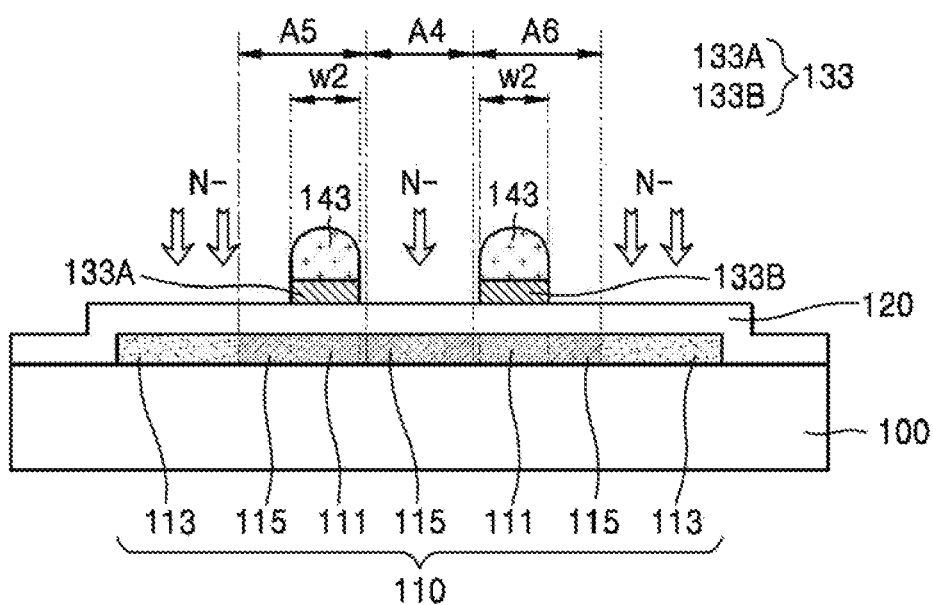

According to an embodiment, referring to FIG. 3F, the semiconductor pattern 110 is doped with the second impurities N− using the second photosensitive pattern 143 and/or the gate electrode 133 as masks. The concentration of the second impurities is lower than the concentration of the first impurities. The second impurities may include boron ions or phosphorous ions, as like the first impurities, at a concentration of about $1 \times 10^{10}$ atoms/cm$^2$ or more, for example, about $1 \times 10^{13}$ atoms/cm$^2$ or more, which is lower than that of the first impurities.

According to an embodiment, as described above, the widths of each of the first and second gate electrodes 133A and 133B is less than that of the fifth and sixth areas A5 and A6, respectively, and thus, a portion of the fifth and sixth areas A5 and A6 forms a lightly-doped drain (LDD) area 115 doped with the second impurities. The channel area 111 is formed at a region of the semiconductor pattern 110 below the gate electrode 133, into which no first impurities or second impurities are implanted. Sequentially, from the outside toward the center of the semiconductor pattern 110, the heavily-doped area 113, the LDD area 115, and the channel area 111 are formed, and in the center of the semiconductor pattern 110, the LDD area 115 is formed. An area of the semiconductor pattern 110 between the first gate electrode 133A and the second gate electrode 133B, that is, the fourth area A4, a portion of the fifth area A5, and a portion of the sixth area A6, are doped only with the second impurities.

Figure 3G:
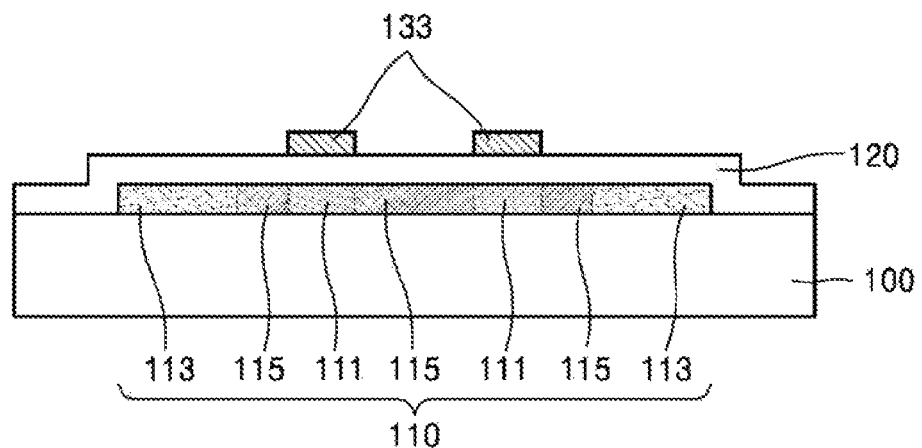

According to an embodiment, referring to FIG. 3G, the second photosensitive pattern 143 is removed by a photoresist (PR) strip. A gate electrode 133 having a dual gate electrode structure that includes the first gate electrode 133A and the second gate electrode 133B is formed on the first insulating layer 120.

Figure 4:
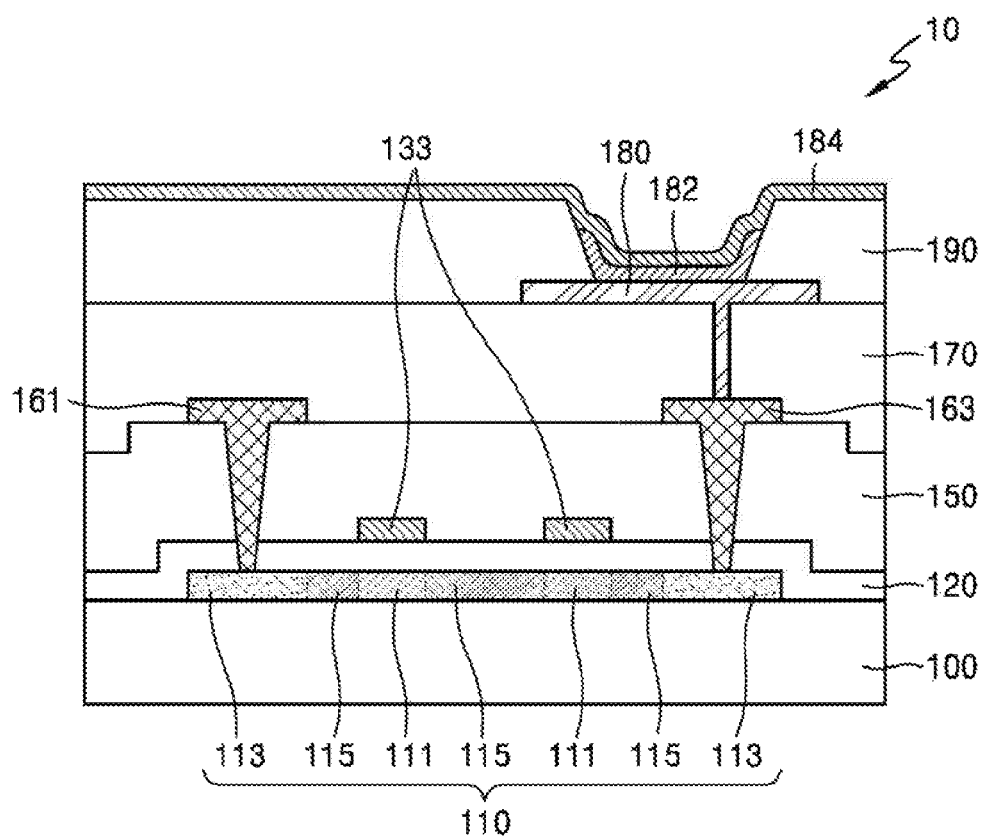
FIG. 4 is a cross-sectional view that illustrates an organic light-emitting display apparatus that includes an thin film transistor substrate of FIG. 3G.

FIG. 4 is a cross-sectional view that illustrates an organic light-emitting display apparatus that includes the thin film transistor substrate of FIG. 3G.

According to an embodiment, referring to FIG. 4, a second insulating layer 150 is formed on the thin film transistor substrate, which is described with reference to FIGS. 1 to 3G, and contact holes are formed through the second insulating layer 150 and the first insulating layer 120 to expose a portion of the source and drain areas 113. Thereafter, a second conductive layer is laminated thereon, and the second conductive layer is patterned. As a result of the patterning, the source and drain electrodes wirings 161 and 163 are formed on the second insulating layer 150. The source and drain electrodes wirings 161 and 163 are electrically connected via the contact holes to source and drain areas corresponding to the heavily-doped areas 113, which are effectively source and drain electrodes.

According to embodiments, the source and drain electrodes wirings 161 and 163 may have a single-layer or a multi-layer structure using one or more metals selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

According to embodiments, a third insulating layer 170, that is, a planarization layer, is formed on the source and drain electrodes wirings 161 and 163. A pixel electrode 180 is formed on the third insulating layer 170. The pixel electrode 180 can be connected to the drain electrode wirings 163 via a contact hole formed in the third insulating layer 170.

The pixel electrode 180 may include at least one transparent conductor selected from indium tin oxide (ITO), indium zinc oxide (IZO), zinc oxide (ZnO), indium oxide ($In_2O_3$), indium gallium oxide (IGO), and aluminum zinc oxide (AZO). Alternatively, the pixel electrode 180 may include a triple-layer structure of a transparent conductive oxide layer/a semi-transmissive metal layer/a transparent conductive oxide layer.

According to an embodiment, a fourth insulating layer 190 is formed on the pixel electrode 180, and an organic light-emitting device can be formed on the fourth insulating layer 190. The organic light-emitting device is formed at a position corresponding to the pixel electrode 180 and includes an intermediate layer 182 and a counter electrode 184.

According to embodiments, the intermediate layer 182 includes an organic emission layer that emits red, green, or blue light, and a low-molecular organic material or a high-molecular organic material may be used in the organic emission layer. If the organic emission layer includes a low-molecular organic material, the organic emission layer is disposed in the center, a hole transport layer (HTL) and a hole injection layer (HIL) are disposed proximal to the pixel electrode 180, and an electron transport layer (ETL) and an electron injection layer (EIL) are disposed proximal to the counter electrode 184. In addition, appropriate layers other than the HIL, HTL, ETL, and EIL can be stacked if necessary.

According to embodiments, the counter electrode 184 that faces the pixel electrode 180 is formed on the intermediate layer 182. The counter electrode 184 may be a transparent electrode or a reflective electrode. If the counter electrode 184 is a transparent electrode, a metal having a low work function, such as Li, Ca, LiF/Ca, LiF/Al, Al, Ag, Mg, or a compound thereof, can be vacuum-deposited proximal to the organic emission layer, and an auxiliary electrode layer or a bus electrode line of a transparent conductive oxide of ITO, IZO, ZnO, or $In_2O_3$ can be formed thereon. If the counter electrode 184 is a reflective electrode, Li, Ca, LiF/Ca, LiF/Al, Al, Ag, Mg, or a compound thereof can be vacuum-deposited on the top surface. However, embodiments are not limited thereto, and an organic material, such as a conductive polymer, may be used in the pixel electrode 180 and the counter electrode 184.

According to embodiments, an organic light-emitting display apparatus 10 having a dual gate electrode structure includes the LDD area 115 in the semiconductor pattern 110 to reduce off current. In addition, as the organic light-emitting display apparatus 10 includes the LDD area 115 between the pair of gate electrodes 133, the gap between the pair of gate electrodes 133 can be reduced compared to a comparative example of the present disclosure in which an LDD area (N−)/a heavily-doped area (N+)/an LDD area (N−) are disposed between the pair of gate electrodes. Therefore, a method of manufacturing the organic light-emitting display apparatus 10 according to an exemplary embodiment can be used to manufacture a high-resolution model.

According to a method according to an embodiment of manufacturing the organic light-emitting display apparatus 10, both the LDD area 115 and the heavily-doped area 113 can be formed using one mask, and thus, there is no additional photo masking, and a process for implanting impurities ions can be relatively simplified. In addition, the organic light-emitting display apparatus 10 according to an embodiment includes the LDD area 115 adjacent to the heavily-doped area 113, improving the performance of the LDD structure.

A thin film transistor substrate of FIGS. 1 to 3G is illustrated up to a process of forming the gate electrode 133. However, embodiments are not limited thereto. As used herein, the term "thin film transistor substrate" means a thin film transistor formed on the substrate 100. The term "thin film transistor substrate" may mean a thin film transistor formed on the substrate 100 as shown in FIG. 3G, a thin film transistor formed up to the source and drain electrodes wirings 161 and 163 on the thin film transistor as shown in FIG. 4, a thin film transistor formed up to the third insulating layer 170, or a thin film transistor formed up to the pixel electrode 180.

As described above, in a method according to an embodiment of manufacturing an organic light-emitting display apparatus, both a lightly-doped drain (LDD) area and a heavily-doped area can be formed in one masking, and thus, there is no additional photo masking, and a process for implanting impurities ions can be relatively simplified.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing a thin film transistor substrate, the method comprising:
   forming a semiconductor pattern on a substrate, wherein the semiconductor pattern comprises a first area, a second area, and a third area, wherein the second area and the third area are located on each side of the first area;
   forming an insulating layer on the substrate to cover the semiconductor pattern;
   forming a metal pattern layer on the insulating layer using a first photosensitive pattern;
   doping the semiconductor pattern with first impurities using the first photosensitive pattern;
   forming a gate electrode by patterning the metal pattern layer using a second photosensitive pattern; and
   doping the semiconductor pattern with second impurities having a lower concentration than the first impurities,
   wherein the first area of the semiconductor pattern comprises a fourth area, a fifth area and a sixth area, the fourth area corresponds to a central portion of the first area, and the fifth area and the sixth area are located on each side of the fourth area,
   wherein, a thickness of a portion of the first photosensitive pattern that corresponds to the fourth area is leas than a thickness of a portion corresponding to the fifth area and the sixth area.

2. The method of claim 1, wherein the metal pattern layer is formed on a position corresponding to the first area of the semiconductor pattern.

3. The method of claim 1, wherein doping the semiconductor pattern with first impurities comprises doping the second area and the third area of the semiconductor pattern with the first impurities.

4. The method of claim 1, wherein the first photosensitive pattern is formed by using one of a slit mask and a half-tone mask.

5. The method of claim 1, wherein the second photosensitive pattern is formed by a same mask process as that of the first photosensitive pattern.

6. The method of claim 1, wherein the second photosensitive pattern is formed by ashing the first photosensitive pattern.

7. The method of claim 1, wherein, a thickness of a portion of the second photosensitive pattern corresponding to the fifth area and the sixth area is less than the thickness of the portion of the first photosensitive pattern corresponding to the fifth area and the sixth area, and the second photosensitive pattern comprises an opening corresponding to the fourth area.

8. The method of claim 1, wherein forming the gate electrode comprises forming a first gate electrode and a second gate electrode spaced apart from each other corresponding to the fifth area and the sixth area, respectively.

9. The method of claim 8, wherein the fourth area of the semiconductor pattern corresponds to a space between the first gate electrode and the second gate electrode and is doped with only the second impurities.

10. The method of claim 8, wherein a width of the first gate electrode and a width of the second gate electrode are less than a width of the fifth area and a width of the sixth area, respectively.

11. The method of claim 10, wherein doping the semiconductor pattern with second impurities is performed using the gate electrode as a mask.

12. The method of claim 11, Wherein the fourth area, a portion of the fifth area and a portion of the sixth area of the semiconductor pattern are doped with the second impurities.

13. A method of manufacturing a thin film transistor substrate, the method comprising:
   forming a semiconductor pattern on a substrate;
   forming a metal pattern layer on the semiconductor pattern using a first photosensitive pattern;
   doping the semiconductor pattern with first impurities using the first photosensitive pattern;
   forming a second photosensitive pattern using the first photosensitive pattern;
   forming a gate electrode by patterning the metal pattern layer using the second photosensitive pattern to form a first gate electrode and a second gate electrode spaced apart from each other; and
   doping the semiconductor pattern with second impurities having a lower concentration than the first impurities using the gate electrode as a mask.

14. The method of claim 13, wherein the semiconductor pattern comprises a first area, a second area, and a third area, wherein the second area and the third area are disposed on each side of the first area, the metal pattern layer is formed on a position corresponding to the first area of the semiconductor pattern, and the first impurities are doped into the second area and the third area of the semiconductor pattern.

15. The method of claim 14, wherein the first area of the semiconductor pattern comprises a fourth area, a fifth area and a sixth area, the fourth area corresponds to a central portion of the first area, and the fifth area and the sixth area are located on each side of the fourth area, wherein the first gate electrode and second gate electrode are formed corresponding to the fifth area and the sixth area, respectively, and the fourth area of the semiconductor pattern corresponds to a space between the first gate electrode and the second gate electrode.

16. The method of claim 15, wherein a width of the first gate electrode and a width of the second gate electrode are less than a width of the fifth area and a width of the sixth area, respectively, and the fourth area, a portion of the fifth area and a portion of the sixth area of the semiconductor pattern are doped with the second impurities.

17. The method of claim 15, wherein:
   a thickness of a portion of the first photosensitive pattern that corresponds to the fourth area is less than a thickness of a portion corresponding to the fifth area and the sixth area; and
   a thickness of a portion of the second photosensitive pattern corresponding to the fifth area and the sixth area is less than the thickness of the portion of the first photosensitive pattern corresponding to the fifth area and the sixth area, and the second photosensitive pattern comprises an opening corresponding to the fourth area.

18. The method of claim 14, further comprising forming an insulating layer on the substrate to cover the semiconductor pattern,
   wherein forming a metal pattern layer on the insulating layer using a first photosensitive pattern comprises sequentially stacking a metal layer and a photosensitive layer on the insulating layer, forming the first photosensitive pattern from the photosensitive layer using a photo mask, and etching the metal layer using the first photosensitive pattern as a mask to form the metal pattern layer.

\* \* \* \* \*